United States Patent [19]
Vanderschoot et al.

[11] Patent Number: 6,034,558
[45] Date of Patent: Mar. 7, 2000

[54] METHOD AND APPARATUS FOR COMPENSATING FOR THERMAL DRIFT IN A LOGIC CIRCUIT

[75] Inventors: Hens Christopher Vanderschoot, Tigard; Timothy M. Wasson, Portland, both of Oreg.

[73] Assignee: Credence Systems Corporation, Fremont, Calif.

[21] Appl. No.: 08/895,722

[22] Filed: Jul. 17, 1997

[51] Int. Cl.[7] ................................................ H03H 11/26
[52] U.S. Cl. .......................... 327/277; 327/278; 327/279
[58] Field of Search ............................. 327/262, 270–277, 327/279

[56] References Cited

U.S. PATENT DOCUMENTS

| | | | |
|---|---|---|---|
| 4,494,021 | 1/1985 | Bell et al. | 327/270 |
| 4,637,018 | 1/1987 | Flora et al. | 327/273 |
| 4,847,870 | 7/1989 | Butcher | 375/333 |
| 5,087,842 | 2/1992 | Pulsipher et al. | 327/270 |
| 5,281,874 | 1/1994 | Sorrells et al. | 327/269 |

*Primary Examiner*—Kenneth B. Wells
*Attorney, Agent, or Firm*—Smith-Hill and Bedell

[57] ABSTRACT

A system for compensating for thermal drift of an output signal (OUT1) produced by a logic circuit in response to an input CLOCK signal after a temperature dependent delay includes a variable delay circuit, an oscillator and a digital phase lock controller. The delay circuit delays the OUT1 signal to produce a compensated output signal (OUT2) with a variable delay controlled by input CONTROL data. The oscillator generates an output signal (OSC_OUT) having a period also controlled by the input CONTROL data which is substantially proportional to the sum of the temperature dependent delay of the logic circuit and the delay of the variable delay circuit. The digital phase lock controller continually monitors the period of the OSC_OUT signal and adjusts the CONTROL data so that the period of the OSC_OUT signal remains substantially constant. This ensures that the delay between the CLOCK signal and OUT2 remains constant despite temperature dependent variations in the delay of the logic circuit.

16 Claims, 1 Drawing Sheet

METHOD AND APPARATUS FOR COMPENSATING FOR THERMAL DRIFT IN A LOGIC CIRCUIT

BACKGROUND OF THE INVENTION

1. Field of the Invention

The present invention relates in general to a system for compensating for thermal drift of a logic circuit output signal.

2. Description of Related Art

A typical digital logic circuit produces an output signal in delayed response to an input data or clock signal. It is often desirable that the logic circuit provide a fixed delay between the input signal and the output signal. However the delay between input and output signals will often be somewhat dependent on the temperature of the integrated circuit implementing the logic circuit because the switching speed of gates forming the logic circuit is temperature dependent, particularly for CMOS integrated circuits. This temperature dependency of the timing of the output signal with respect to the clock signal is known as "thermal drift".

Some prior art thermal drift compensation systems attempt to control thermal drift by maintaining an integrated circuit at a constant temperature. Such systems include a heater for warming the integrated circuit and some means for sensing the temperature of the integrated circuit and for turning on the heater when the circuit temperature falls below a desired set point. Such systems are expensive and difficult to implement.

Other prior art systems control thermal drift by adjusting the voltage of the power supplied to transistors forming the logic circuit. The higher the supply voltage, the faster the transistors switch. Switching speed can be sensed, for example, by sensing the frequency of oscillation of a ring oscillator formed on the same integrated circuit with the logic circuit and constructed of similar transistors. When the oscillator frequency falls below or rises above a desired set point, the power supply voltage to the transistors of the oscillator is increased or decreased accordingly so as to maintain the oscillator frequency at the set point. Since the power signal also supplies the transistors forming the logic circuit, by stabilizing the oscillator frequency we ensure that the switching speed of the logic circuit remains constant despite variations in temperature of the integrated circuit. This system controls thermal drift well but the circuitry required to provide an adjustable analog power supply signal to the integrated circuit is difficult and expensive to implement.

What is needed is a simple and effective system for compensating for thermal drift of a logic circuit which can be implemented with digital circuitry that does not have to control analog power signals and which does not require internal or external heaters.

SUMMARY OF THE INVENTION

A logic circuit subject to thermal drift produces an output signal (OUT1) in response to an input signal (INPUT) after a temperature dependent delay. In accordance with one aspect of the invention, a system for compensating for that thermal drift includes a variable delay circuit, an oscillator and a digital phase lock controller. The delay circuit delays the OUT1 signal to produce a compensated output signal (OUT2) with a variable delay controlled by CONTROL data produced by the digital phase lock controller. The oscillator generates an output signal (OSC_OUT) having a period which is also controlled by the input CONTROL data and which is substantially proportional to the sum of the temperature dependent delay of the logic circuit and the delay of the variable delay circuit. The digital phase lock controller continually monitors the period of OSC_OUT and adjusts the CONTROL data so that the period of OSC_OUT remains substantially constant. This ensures that the delay between the INPUT signal and OUT2 remains constant despite temperature dependent variations in the delay of the logic circuit.

In accordance with another aspect of the invention, the digital phase lock controller monitors the period of the OSC_OUT signal by counting periods of a stable reference clock signal (REFCLK) that occur during a predetermined number of OSC_OUT cycles. If the REFCLK period count is too high, the CONTROL data is adjusted to decrease the period of OSC_OUT, thereby also decreasing the delay between OUT1 and OUT2. If the REFCLK period count is too low, the CONTROL data is adjusted to increase the period of the OSC_OUT signal, thereby also increasing the delay between OUT1 and OUT2.

It is accordingly an object of the invention to provide a purely digital circuit which compensates for thermal drift of an output signal produced by a logic circuit.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 depicts in block diagram form a system in accordance with the present invention for compensating for thermal drift in a logic circuit.

DESCRIPTION OF THE PREFERRED EMBODIMENT(S)

Figure 1:
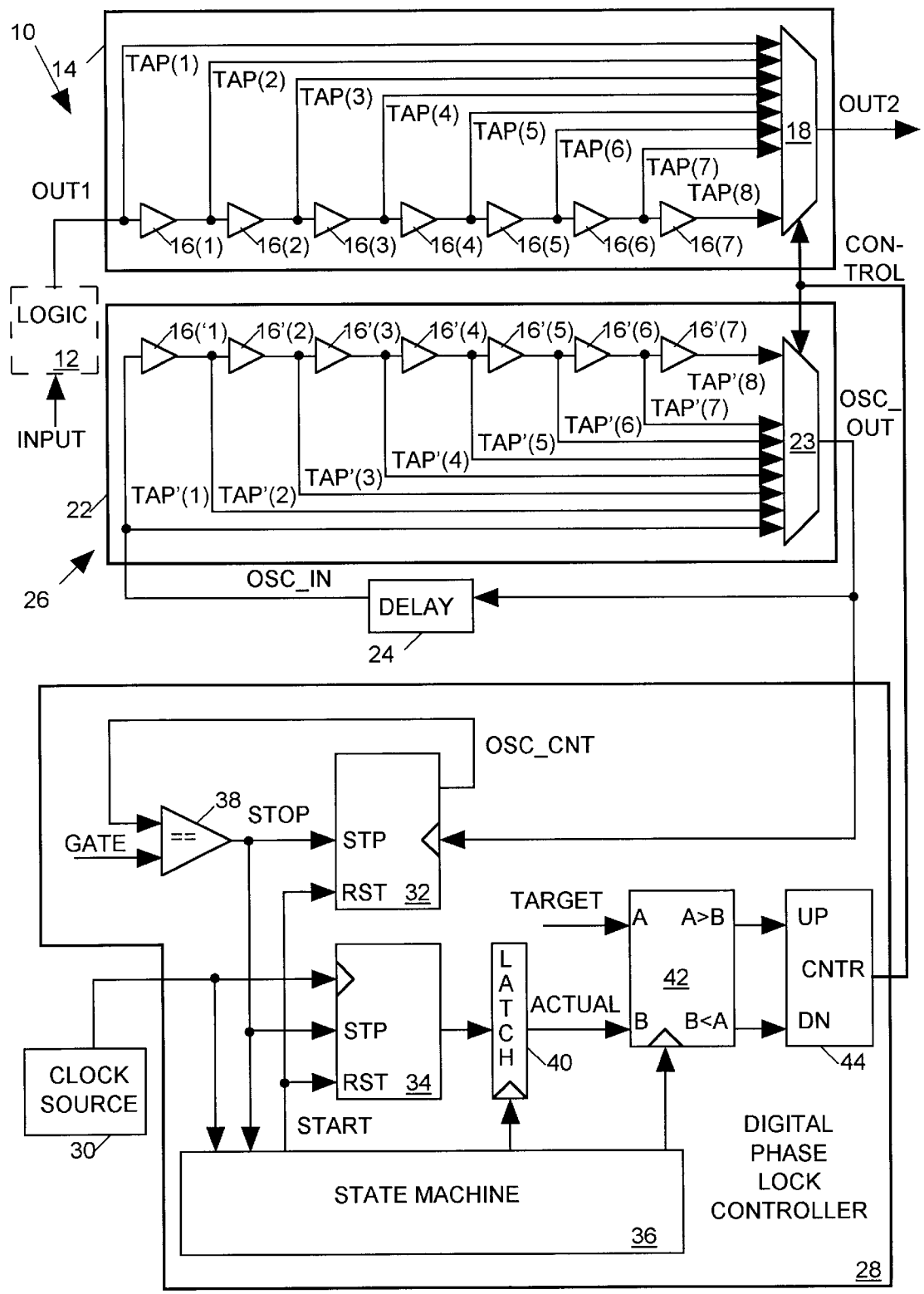

In many applications it is desirable that an output pulse produced by a logic circuit lag an input data or clock signal pulse by a fixed amount of time that is not dependent on the temperature of the logic circuit. However the delay between the input signal and the output signal is often temperature dependent, particularly in CMOS circuits. Such a logic circuit is said to be subject to "thermal drift" because the timing of its output signal drifts with respect to the input signal when the logic circuit temperature changes. The present invention compensates for such thermal drift.

FIG. 1 illustrates in block diagram form a thermal compensation circuit 10, in accordance with the present invention, suitable for use in connection with a logic circuit 12 that is subject to thermal drift. Logic circuit 12 produces an output signal OUT1 in delayed response to an input signal INPUT with a delay that is temperature dependent. The INPUT signal may be a data signal or may be a periodic or an aperiodic clock signal. Compensation circuit 10 further delays the OUT1 signal to produce a second output signal OUT2. The delay provided by thermal compensation circuit 10 is continuously adjusted to compensate for thermal drift of logic circuit 12, thereby to ensure that the OUT2 pulse lags the INPUT signal pulse by a fixed delay time that is not temperature dependent. In particular, if the delay between INPUT and OUT1 increases, circuit 10 decreases the delay between OUT1 and OUT2 by a compensating amount so that the total delay between INPUT and OUT2 remains substantially constant. Conversely, if the delay between INPUT and OUT1 decreases, circuit 10 increases the delay between OUT1 and OUT2 by a compensating amount.

A variable delay circuit 14 within compensation circuit 10 provides the delay between OUT1 and OUT2. Circuit 14 includes a set of seven series-connected delay elements 16(1)–16(7) and a multiplexer 18. Delay elements 16(1)–16(7) are formed by similar logic gates which produce an output pulse in delayed response to an input pulse. The OUT1 pulse travels through gates 16(1)–16(7) to appear as signals TAP(1)–TAP(7) at the inputs of corresponding elements 16(1)–16(7) and as a signal TAP(8) at the output of delay element 16(7). Multiplexer 18 receives TAP(1)–TAP(8) as separate inputs and delivers the OUT1 signal pulse appearing at selected one of signals TAP(1)–TAP(8) as compensation circuit 10 output signal OUT2. A 3-bit input CONTROL signal tells multiplexer 18 which TAP signal to select. Since the delay of control circuit 14 is determined by the number of delay elements 16 OUT1 must pass through to become OUT2, the CONTROL signal controls the delay provided by delay circuit 14.

Compensation circuit 10 includes a second variable delay circuit 22 identical to variable delay circuit 14 including delay elements 16'(1)–16'(7) and a multiplexer 23 controlled by the same CONTROL data. Multiplexer 23 selects from among a set of eight input tap signals TAP'(1)–TAP'(8) appearing at inputs or outputs of series connected delay elements 16'(1)–16'(7). Delay circuit 22, which mimics the delay of delay circuit 14 because it has the same design and is controlled by the same signal CONTROL, delays an input signal OSC_IN to produce an output signal OSC_OUT. Thus the OSC_OUT signal lags OSC_IN by the same amount of time that OUT2 lags OUT1. The OSC_OUT signal is further delayed by another delay circuit 24 to produce the OSC_IN signal supplied to the input of delay circuit 22. Delay circuit 24, which may be a conventional delay line formed by series connected gates, is designed to mimic the delay of the logic circuit 12 suitably by providing the same number and sizes of logic gates between its input and output as logic circuit 12 provides between INPUT and OUT1. Delay circuit 24 is suitably fabricated on the same integrated chip as logic circuit 12 so as to minimize temperature and process variations between delay circuit 24 and logic circuit 12. Thus the delay of delay circuit 24 thermally drifts substantially in unison with the delay of logic circuit 12. Interconnected as described, delay circuits 22 and 24 form a ring oscillator 26. Because delay circuit 22 mimics the delay of delay circuit 14 and because delay circuit 24 mimics the delay of logic circuit 12, the period of oscillation of oscillator 26 output signal OSC_OUT is equal to the total delay between INPUT and OUT2.

A digital phase lock controller 28 monitors the period of the OSC_OUT signal and adjusts the delay of delay circuit 22 so that OSC_OUT has a substantially constant period despite temperature dependent changes in the delay of delay circuit 24. Phase lock controller 28 adjusts the delay of delay circuit 22 by adjusting the value of the three-bit CONTROL signal. To increase the delay of delay circuit 22, controller 28 increases the value of CONTROL so that multiplexer 23 switches from selecting TAP'(n) to selecting TAP'(n+1). To decrease the delay of delay circuit 22, controller 28 decreases the value of CONTROL so that multiplexer 23 switches from selecting TAP'(n) to selecting TAP'(n−1). Such increase or decrease in the value of CONTROL results in a similar change in delay of delay circuit 14.

Since the delay between INPUT and OUT2 is equal to the period of OSC_OUT, then by holding the period of OSC_OUT substantially constant, controller 28 also holds the delay between INPUT and OUT2 substantially constant, thereby compensating for any thermal drift in logic circuit 12. When the delay of logic circuit 12 increases or decreases, the delay of delay circuit 24 increases or decreases by a similar amount. This causes an increase or decrease in the period of OSC_OUT. Controller 28 responds to the change in OSC_OUT period by forcing a compensating decrease or increase in the delay of delay circuit 22 so as to restore the OSC_OUT period to the desired set point. At the same time controller 28 forces a similar compensating decrease or increase in the delay of delay circuit 14, thereby ensuring that the delay between INPUT and OUT2 remains substantially constant despite thermal induced changes in the delay logic circuit 12.

Controller 28 counts the number of pulses of a highly stable input reference clock (REFCLK) produced by a clock source 30 during a time oscillator 26 requires to produce a fixed number (GATE) of OSC_OUT pulses. If the OSC_OUT period is too long, the count (ACTUAL) of REFCLK pulses exceeds a predetermined TARGET value and controller 28 decreases the period of OSC_OUT by decreasing the value of CONTROL, thereby decreasing delay of delay circuits 14 and 22. Conversely, if the ACTUAL count of REFCLK pulses is lower than the TARGET value, controller 28 increases the period of OSC_OUT by increasing CONTROL, thereby increasing the delay of delay circuits 14 and 22.

Controller 28 includes a pair of counters 32 and 34. The OSC_OUT signal clocks counter 32 while the REFCLK signal clocks counter 34. At system startup a state machine 36, clocked by the REFCLK signal, initially supplies a pulse to reset inputs (RST) of both counters to reset their counts and to enable them to begin counting pulses of the signals driving their clock inputs. A comparator 38 compares the count output (OSC_CNT) of counter 32 to input data (GATE) indicating a number of OSC_OUT pulses that counter 32 is to count. When OSC_CNT reaches the value of GATE, comparator 38 supplies an output pulse (STOP) to stop inputs (STP) of counters 32 and 34. The STOP pulse tells counters 32 and 34 to stop counting and also tells state machine 36 to clock a latch 40, for latching the ACTUAL count output of counter 34 onto a B input of an A/B comparator 42. The TARGET value is supplied to an A input of comparator 42. After clocking latch 40, state machine 36 clocks comparator 42. If ACTUAL is greater than TARGET, comparator 42 responds to the pulse from state machine 36 by pulsing a DN input of an up/down counter 44 producing the CONTROL data. In response to the pulse at its DN input, counter 44 decreases the CONTROL data value by one, thereby causing delay circuit 22 to decrease its delay. This decreases the period of OSC_OUT. If ACTUAL is less than TARGET, comparator 42 responds to the pulse from state machine 36 by pulsing an UP input of counter 44. Counter 44 responds by increasing the CONTROL data value by one, causing delay circuits 22 to increase its delay, thereby increasing the period of OSC_OUT.

After pulsing the clock input of comparator 42, state machine 36 sends another START signal pulse to the RST inputs of counters 32 and 34 to start another pulse counting and CONTROL adjustment cycle. Thus phase lock controller 28 continuously adjusts CONTROL so as to hold the period of oscillator 28, and therefor the delay between INPUT and OUT2, substantially constant. Since the INPUT to OUT2 delay is a function of the values of the GATE and TARGET input data, the delay may be adjusted by appropriately adjusting these data values inputs to controller 28.

Thus has been shown and described a purely digital circuit which compensates for thermal drift of an output signal produced by a logic circuit without producing or controlling analog power signals and without using external heaters. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for compensating for thermal drift of a first output signal (OUT1) produced by a logic circuit in response to an input signal (INPUT) after a first temperature dependent delay, the apparatus comprising:

a first delay circuit for receiving and delaying said first output signal with a first variable delay to produce a second output signal (OUT2), the first variable delay being controlled by a value of a digital control signal (CONTROL) provided as input to said first variable delay circuit;

an oscillator for generating an oscillator output signal (OSC_OUT) having a period controlled by said value of said digital control signal, the oscillator output signal period being substantially proportional to a sum of said first temperature dependent delay and said first variable delay; and means for continually monitoring the oscillator output signal period and adjusting said value of said digital control signal so that said oscillator output signal period remains substantially constant, wherein said oscillator comprises a second delay circuit for receiving and delaying an oscillator input signal (OSC_IN) with a second variable delay to produce an oscillator output signal, the second variable delay being controlled by said value of said digital control signal provided as input to said second variable delay circuit, and a third delay circuit for receiving and delaying said oscillator output signal to produce said oscillator input signal with a second temperature dependent delay substantially similar to said first temperature dependent delay.

2. The apparatus in accordance with claim 1 wherein said means for continually adjusting said value of said digital control signal so that said oscillator output signal period remains substantially constant comprises:

means for generating a periodic reference clock signal (REFCLK); and control means for generating a count of periods of said reference clock signal occurring during a time spanned by a plurality of periods of said oscillator output signal and for adjusting said value of said digital control signal in response to the generated count so that the period of said oscillator output signal remains substantially constant.

3. The apparatus in accordance with claim 1 wherein said first delay circuit comprises:

a tapped delay line for receiving and delaying said first output signal to produce a plurality of successively delayed TAP signals, and a multiplexer for receiving said TAP signals and for selecting one of said TAP signals for output as said second output signal in response to said value of said digital control signal.

4. The apparatus in accordance with claim 2 wherein said control means comprises:

a first counter for generating a count (OSC_CNT) of periods of said oscillator output signal until receiving a stop signal (STOP), a second counter for generating a count (ACTUAL) of periods of said reference clock signal until receiving said stop signal, means for generating and transmitting said stop signal to said first and second counters when said count of period of said oscillator output signal reaches a first count limit (GATE), and means for performing a comparison of said count of periods of said reference clock signal to a second count limit (TARGET) and for altering said value of said digital control signal in accordance with a result of said comparison so as to alter said first variable delay.

5. The apparatus in accordance with claim 4 wherein said means for generating a comparison of said count of periods of said reference clock signal to a second count limit and for altering said value of said digital control signal in accordance ith a result of said comparison so as to alter said first variable delay comprises:

means for pulsing a count up signal when said count of periods of said reference clock signal is less than said second count limit and for pulsing a count down signal when said count of periods of said reference clock signal is greater than said second count limit; and an up/down counter for generating said value of said digital control signal, said up/down counter incrementing said value in response to said count up signal and decrementing said value in response to said count down signal.

6. The apparatus in accordance with claim 2 wherein said control means comprises:

means for generating a periodic reference clock signal (REFCLK);

a first counter for generating a count (OSC_CNT) of periods of said oscillator output signal until receiving an input signal (STOP), a second counter for generating a count (ACTUAL) of periods of said reference clock signal until receiving STOP, means for generating and transmitting STOP to said first and second counters when said OSC_CNT reaches a first predetermined count limit (GATE), and means for performing a comparison of said count of period of said oscillator output signal to a second count limit (TARGET) and for altering said value of said digital control signal in accordance with a result of said comparison so as to alter said first variable delay.

7. The apparatus in accordance with claim 3 wherein said control means comprises:

means for generating a periodic reference clock signal (REFCLK);

a first counter for generating a count (OSC_CNT) of periods of said oscillator output signal until receiving an input signal (STOP), a second counter for generating a count (ACTUAL) of periods of said reference clock signal until receiving STOP, means for generating and transmitting STOP to said first and second counters when said count of period of said oscillator output signal reaches a first count limit (GATE), and means for performing a comparison of said count of periods of said reference clock signal to a second count limit (TARGET) and for altering said value of said digital control signal in accordance with a result of said comparison so as to alter said first variable delay.

8. The apparatus in accordance with claim 7 wherein said means for generating a comparison of said count of periods of said reference clock signal to a second count limit and for altering said value of said digital control signal in accordance with a result of said comparison so as to alter said first variable delay comprises:

means for pulsing a count up signal when said count of periods of said reference clock signal is less than said second count limit and for pulsing a count down signal when said count of periods of said reference clock signal is greater than said second count limit; and an up/down counter for generating said value of said digital control signal, said up/down counter incrementing said value in response to said count up signal and decrementing said value in response to said count down signal.

9. A method for compensating for thermal drift of a first output signal (OUT1) produced by a logic circuit in response to an input signal (INPUT) after a first temperature dependent delay, the method comprising the steps of:

delaying said first output signal with a first variable delay controlled by a value of a digital control signal (CONTROL) to produce a second output (OUT2) signal, generating an oscillating signal (OSC_OUT) having a period controlled by said value of said digital control signal and being substantially proportional to a sum of said first temperature dependent delay and said first variable delay; and continually monitoring the period of said oscillator output signal and adjusting said value of said digital control signal so that the period of said oscillator output signal remains substantially constant, wherein the step of generating an oscillating signal comprises the substeps of:

delaying an oscillator input signal (OSC_IN) with a second variable delay to produce said oscillator output signal, the second variable delay being controlled by said value of said digital control signal, delaying said oscillator output signal to produce said oscillator input signal with a second temperature dependent delay substantially matching said first temperature dependent delay.

10. The method in accordance with claim 9 wherein the step of continually adjusting said value of said digital control signal so that the period of said oscillator output signal remains substantially constant comprises the substeps of:

generating a periodic reference clock signal (REFCLK); and generating a count of periods of said reference clock signal occurring during a time spanned by a plurality of periods of said oscillator output signal and adjusting said value of said digital control signal in response to the generated count so that the period of said oscillator output signal remains substantially constant.

11. The method in accordance with claim 9 wherein the step of delaying said first output signal with a first variable delay controlled by said value of said digital control signal to produce said second output signal comprises the substeps of:

progressively delaying said first output signal to produce a plurality of successively delayed TAP signals, and providing a selected one of said TAP signals as said second output signal, the one TAP signal being selected in response to said value of said digital control signal.

12. The method in accordance with claim 10 wherein the step of generating a count of periods of said oscillator output signal occurring during a time spanned by a predetermined plurality of periods of said oscillator output signal and adjusting said value of said digital control signal in response to the generated count so that the period of said oscillator output signal remains substantially constant comprises the substeps of:

generating a count (OSC_CNT) of periods of said oscillator output signal until occurrence of a STOP signal, generating a count (ACTUAL) of periods of said reference clock signal until occurrence of said STOP signal, generating said STOP signal when said count of periods of said oscillator output signal reaches a first count limit (GATE), and performing a comparison of said count of period of said reference clock signal to a second count limit (TARGET) and altering said value of said digital control signal in accordance with a result of said comparison so as to alter said first variable delay.

13. The method in accordance with claim 12 wherein the step of performing a comparison of said count of periods of said reference clock signal to a second count limit and altering said value of said digital control signal in accordance ith a result of said comparison so as to alter said first variable delay comprises the steps of:

incrementing said value of said digital control signal when said count of periods of said reference clock signal is less than said second count limit, and decrementing said value when said count of periods of said reference clock signal exceeds said second count limit.

14. The method in accordance with claim 9 wherein the step of delaying said first output signal with a first variable delay to produce said second output signal comprises the substeps of:

progressively delaying said first output signal to produce a plurality of successively delayed TAP signals, selecting one of said TAP signals in response to said value of said digital control signal and providing the selected TAP signal as said second output signal.

15. The method in accordance with claim 9 wherein the step of generating a count of periods of said reference clock signal occurring during a time spanned by a predetermined plurality of periods of said oscillator output signal and adjusting said value of said digital control signal in response to the generated count so that the period of said oscillator output signal remains substantially constant comprises the substeps of:

generating a count (OSC_CNT) of periods of said oscillator output signal until occurrence of a STOP signal, generating a count (ACTUAL) of periods of said reference clock signal until occurrence of a STOP signal, generating said STOP signal when said count of periods of said oscillator output signal reaches a first count limit (GATE), performing a comparison of said count of periods of said reference clock signal to a second count limit (TARGET), and altering said value of said digital control signal in accordance with a result of said comparison so as to alter said first variable delay.

16. The method in accordance with claim 11 wherein the step of generating a count of periods of said reference clock signal occurring during a time spanned by a predetermined plurality of periods of said oscillator output signal and adjusting said value of said digital control signal in response to the generated count so that the period of said oscillator output signal remains substantially constant comprises the substeps of:

generating a count (OSC_CNT) of periods of said oscillator output signal until occurrence of a STOP signal, generating a count (ACTUAL) of periods of said reference clock signal until occurrence of said STOP signal, generating said STOP signal when said count of period of said oscillator output signal reaches a first count limit (GATE), performing a comparison of said count of periods of said reference clock signal to a second predetermined count limit (TARGET), and altering said value of said digital control signal in accordance with a result of said comparison so as to alter said first variable delay.

* * * * *